United States Patent [19]

Mitsui

[11] Patent Number: 4,897,123
[45] Date of Patent: Jan. 30, 1990

[54] SOLAR CELLS AND METHOD FOR PRODUCING SOLAR CELLS

[75] Inventor: Kotaro Mitsui, Itami, Japan

[73] Assignee: Mitsubishi Denki Kabushiki Kaisha, Japan

[21] Appl. No.: 251,504

[22] Filed: Sep. 29, 1988

[30] Foreign Application Priority Data

Nov. 28, 1987 [JP] Japan .............................. 62-300975

[51] Int. Cl.$^4$ ...................... H01L 31/06; H01L 31/18
[52] U.S. Cl. ................................... 136/256; 136/249; 136/262; 357/30; 437/2; 437/5
[58] Field of Search ............... 136/256, 262, 249 MS; 357/30 B, 30 J, 30 Q; 437/2, 5

[56] References Cited

U.S. PATENT DOCUMENTS

| 4,144,096 | 3/1979 | Wada et al. | 136/249 MS |
| 4,330,680 | 5/1982 | Goetzberger | 136/247 |
| 4,610,077 | 9/1986 | Minahan et al. | 437/2 |
| 4,694,115 | 9/1987 | Lillington et al. | 136/256 |

FOREIGN PATENT DOCUMENTS

| 60-0783 | 1/1985 | Japan | 136/256 |
| 63-211773 | 9/1988 | Japan | 136/262 |

OTHER PUBLICATIONS

Matsunami, "Progress in Fundamental Research on Photovoltaics", *Technical Digest of the International PVSEC*, pp. 133–138.
Ho et al, "Thin Foil Silicon Solar Cells with Coplanar Back Contacts", IEEE Photovoltaic Specialists Conference, (1981), pp. 102–106.
Kukulka et al, "Large Area, Low Cost Space Solar Cells", IEEE Photovoltaic Specialists Conference, (1982), pp. 146–149.
Mardesich et al, "Mechanical Wraparound Contacted Cell for Low Cost Space Arrays" IEEE Photovoltaic Specialists Conference, (1982), pp. 160–163.
Abstracts of the Fifth ISAS Space Energy Symposium (1986), p. 21, (no translation).

*Primary Examiner*—Aaron Weisstuch
*Attorney, Agent, or Firm*—Leydig, Voit & Mayer

[57] ABSTRACT

A solar cell includes a semiconductor substrate of one conductivity type, at least one separation region of opposite conductivity type extending through the substrate, a first semiconductor layer disposed on the front of the substrate, an opposite conductivity type second semiconductor layer disposed on the first layer to form a rectifying junction, the second layer being in electrical communication with the separation region, a first electrode disposed on the rear surface of the substrate and a second electrode in electrical communication with the second layer and extending to the rear of the substrate. The solar cell may be made by diffusing the separation region in the substrate, epitaxially growing the first and second layers successively on the front of the substrate, establishing electrical communication between the second layer and the separation region at the front, and forming the first and seocnd electrodes. The solar cell has both electrodes on the rear surface, more than one of the solar cells can be made from a single substrate, and the depth of the rectifying junction can be controlled, all producing cells suitable for space applications.

50 Claims, 8 Drawing Sheets

SOLAR CELLS AND METHOD FOR PRODUCING SOLAR CELLS

FIELD OF THE INVENTION

The present invention relates to solar cells and a method for producing them. Each of the solar cells includes two electrodes which are disposed on and accessible from the rear surface of the cells.

BACKGROUND OF THE INVENTION

Solar cells generally include two metallic electrodes for extracting electrical power generated in response to incident light. In most solar cells, at least one of the metallic electrodes is disposed on the front surface, i.e., the light-receiving surface. When such cells are connected in an array, it therefore becomes necessary for front-to-back connections between the electrodes disposed on the front and rear surfaces of the cells. In extraterrestrial applications, metallic electrodes and interconnections are susceptible to damage from plasmas, particularly from ozone plasmas. Accordingly, it is desirable to provide both cell electrodes on the rear, i.e., non-exposed, surface of the solar cells. Solar cell interconnections can thereby be protected from damage caused by ions and plasmas in space environments.

While most solar cells, particularly of the GaAs type, have front and rear electrodes and are thus subjected to the problems noted above, FIG. 11 shows a cross-sectional view of one known solar cell having both its electrodes on the rear surface of the cell. That cell construction is described in a paper by Matsunami presented at the First International PVSEC and published in the *Technical Digest* of that meeting, Nov. 1984, pages 133–138. The solar cell of FIG. 11 includes a p-type substrate 20 having an $n^{30}$-type diffusion layer 21 formed along the front and side surfaces of substrate 20. A $p^{30}$-type layer 22 is formed in the rear surface of substrate 20 for assistance in forming an ohmic contact with a metallic electrode 23 disposed on layer 22. The other electrode of the solar cell comprises digitated metallic stripes 24 on the front surface of layer 21 and metallic interconnections extending from the stripes along the opposite sides of the structure and terminating on the rear side. Thus, both of the electrodes of the solar cell of FIG. 11 are accessible at the rear surface of the cell.

Figure 11:
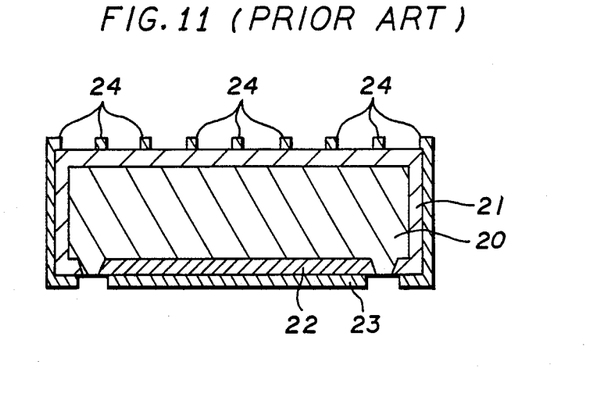
FIG. 11 is a cross-sectional view showing a prior art solar cell including two electrodes accessible at the rear surface of the cell.

The solar cell of FIG. 11 is fabricated in a series of processing steps beginning with coating substrate 20 with a diffusion mask, such as silicon dioxide ($SiO_2$). A window is opened in the mask at the rear surface of the substrate and a p-type dopant is diffused through the window to form layer 22. Thereafter, the entire surface of substrate 20 is again coated with a diffusion mask. The mask is removed in the areas in which $n^{30}$-type layer 21 is to be formed, and an n-type dopant is diffused through those windows to form layer 21. These diffusions form a rectifying pn junction between substrate 20 and layer 21. Metallic electrodes 23 and 24 are deposited by conventional evaporation methods.

The solar cell of FIG. 11 does not have a particularly high light-to-electricity conversion efficiency due, in part, to the diffusion technology it employs for forming the pn junction. Furthermore, because of the requirement for forming $n^{30}$-type diffusion layer 21 on the sides of the device, each cell must be individually produced from a separate substrate. As a result, the cost of manufacturing the cells of FIG. 11 increases as the volume of cells produced increases.

SUMMARY OF THE INVENTION

In view of the foregoing, it is a general aim of the present invention to provide an improved solar cell and fabrication technique which has both electrodes accessible on a single surface, and in addition can be fabricated with multiple cells on a single substrate.

In accomplishing that aim, it is an object of the present invention to provide an improved solar cell having both electrodes accessible at the rear surface of the cell, having a high light-to-electricity conversion efficiency and good resistance to damage from the extraterrestrial environment, yet which can be produced at a relatively low cost.

Another object of the invention is to provide a method for making the desired solar cell.

Other objects and advantages of the present invention will become apparent from the detailed description given hereinafter. The detailed description and specific embodiments described are illustrative only, since various changes and modifications within the spirit and scope of the invention will become apparent to those skilled in the art from the detailed description.

A solar cell according to the present invention includes a semiconductor substrate of a first conductivity type having opposed front and rear surfaces. The substrate includes at least one separation region for receiving an interconnecting electrode. The separation region is of a second conductivity type different from the first conductivity type and extends through the substrate from the front to the rear surface. A first semiconductor layer of the same conductivity type as the substrate is disposed on the front surface and a second semiconductor layer of a different conductivity type is disposed on the first layer to form a rectifying junction. The second semiconductor layer is in electrical communication with the separation region. A first electrode is disposed on the rear surface of the substrate and spaced from the separation region, and a second electrode, in communication with the second layer at the front surface of the cell, extends to the rear surface of the substrate to contact the separation region. Preferably, several cells are made from the same substrate. The substrate is separated into dice along the separation regions, and an interconnecting portion of the second electrode is disposed on the edge of the substrate in contact with the exposed separation region and first and second electrode portions disposed on the separation region at the front and rear surfaces, respectively.

A solar cell according to the invention is prepared in a semiconductor substrate having front and rear surfaces and a first conductivity type by forming at least one separation region in the substrate that extends between the front and rear surfaces and has a conductivity type different from that of the substrate. A first semiconductor layer of the same conductivity type as the substrate is deposited on the first surface and a second semiconductor layer of a different conductivity type is deposited on the first layer to form a rectifying junction. Electrical communication is established between the second layer and the separation region at the front surface of the substrate, preferably either during the deposition of the second layer or by a diffusion step. A first electrode is formed on the rear surface of the substrate spaced from the separation region, and a second electrode in electrical communication with the second layer at the front surface is formed to extend to and contact the separation region at the rear surface. Preferably, a number of cells are formed in the same substrate which is separated into individual cells along the separation regions. The second electrode may be formed by depositing metallic electrode portions on the separation region at the front and rear surfaces and plating an interconnecting electrode portion on the separation region exposed at the edge of the substrate.

The active layers of the solar cell are preferably formed of gallium arsenide (GaAs) which is epitaxially grown, and may be protected by a window layer of aluminum gallium arsenide ($Al_xGa_{1-x}As$) as well as an anti-reflection film.

BRIEF DESCRIPTION OF THE DRAWINGS

FIGS. 2(a)-2(d) are diagrams illustrating a process for producing the solar cell of FIG. 1;

DETAILED DESCRIPTION OF THE PREFERRED EMBODIMENTS

Figure 1:
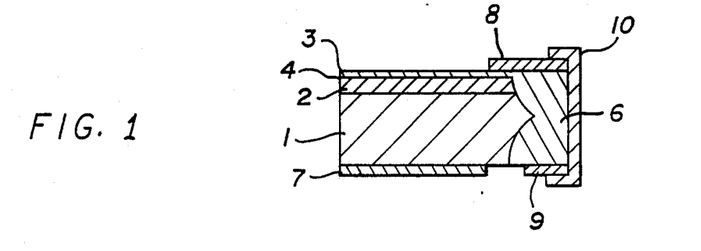
FIG. 1 is a cross-sectional view of an embodiment of a solar cell according to the invention.

FIG. 1 shows a cross-sectional view of an embodiment of a solar cell according to the invention. An n-type GaAs substrate 1 includes an n-type GaAs layer 2 over which a p-type GaAs layer 3 is disposed as the front surface of the cell. The terms front and rear refer to the desired orientation of the cell relative to incident light. In that orientation, light first strikes the front surface, whereas the rear surface is generally and preferably shielded from incident light and, in extraterrestrial applications, from the space environment. Layers 3 and 2 form a pn junction 4. At one end of substrate 1, a p-type separation region 6, formed by diffusing zinc (Zn) into substrate 1, extends through the thickness of the substrate and layers 3 and 4. An electrode 7 is disposed on the rear surface of substrate 1 but is spaced from and is not in contact with separation region 6 at the rear surface. An electrode portion 8 is disposed on and contacts the front surface of the cell on layer 3 and over separation region 6. Another electrode portion 9 is disposed on and is in contact with separation region 6 at the rear surface of the cell. The second electrode is completed by an interconnecting portion 10 that is disposed along the side of substrate 1 in contact with separation region 6 and electrode portions 8 and 9. In the structure of FIG. 1, both of the cell electrodes are accessible at the rear surface of the cell.

Figure 2A:
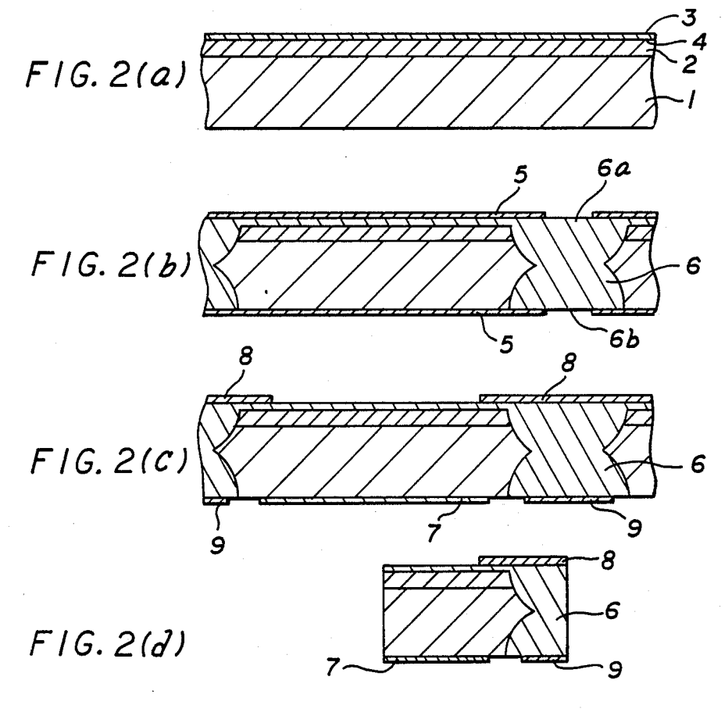

The steps in a method for producing the solar cell of FIG. 1 are illustrated in FIGS. 2(a)-2(d). As shown in FIG. 2(a), the front surface of n-type GaAs substrate 1 has successively deposited thereon n-type GaAs layer 2 and p-type GaAs layer 3. Layers 2 and 3 are deposited, preferably by a conventional epitaxial growth method, such as the metal-organic chemical vapor deposition (MOCVD) method, to produce a high quality pn junction 4. In a typical structure, the thickness of substrate 1 is about 300 microns, the thickness of layer 2 is about 5 microns, and the thickness of layer 3 is about 0.5 microns. In order to produce a good quality pn junction, the MOCVD method is carried out in a temperature range of 700° to 800° C.

In the method illustrated in FIG. 2, after layers 2 and 3 are deposited, separation regions 6 are formed by a diffusion step. The regions for the diffusion are defined by depositing silicon nitride ($Si_3N_4$) films 5 on the front and rear surfaces of substrate 1 and opening windows in the $Si_3N_4$ masking films. As illustrated in FIG. 2(b), windows 6a and 6b are opened in the film masks on the front and rear surfaces, respectively, so that the windows are aligned with each other. In a preferred embodiment, a p-type dopant, such as Zn for a GaAs substrate, is diffused into the substrate at a temperature and for a sufficient time so that the separation region 6 produced extends continuously from the front to the rear surface of substrate 1. Preferably, diffusion of Zn into GaAs is carried out in a conventional closed tube method employing a residual arsenic pressure to prevent dissociation of As from the GaAs substrate. In order to form a p-type separation region extending through an n-type GaAs substrate 300 microns thick, the diffusion must be carried out at a relatively high temperature, e.g., 900° C., for a relatively long period of time, e.g., fifty hours.

As illustrated in FIG. 2(c), after formation of separation region 6, masks 5 are removed and metallic electrode 7 is deposited on the rear surface of substrate 1 spaced from separation region 6. A metallic electrode portion 8 is deposited on the front surface of substrate 1, i.e., on layer 3, in electrical contact with layer 3 and region 6. Another metallic electrode 9 is deposited on the rear surface of the cell, but only in contact with region 6. Typically, electrodes 7 and electrode portions 8 and 9 are deposited by conventional vacuum evaporation processes of metals and metal alloys.

As shown in FIG. 2(d), substrate 1 of FIGS. 2(a)-2(c) is then separated into chips, i.e., individual cells. The separation process, which may be sawing, cleaving, or another dicing technique, cuts through electrode portions 8 and 9 and separation region 6 so that part of each of these elements remains with neighboring dice. Finally, the second electrode is completed by depositing a metallic interconnecting portion 10, as shown in FIG. 1, on the edge of a die contacting region 6 so that electrode portions 8 and 9 are electrically interconnected. Interconnecting portion 10 may be deposited by a conventional plating technique.

The process of FIGS. 2(a)-2(d) can produce a relatively large number of cells from a single substrate, resulting in production costs that are reduced over those incurred in constructing the cell of FIG. 11.

The diffusion process illustrated in FIG. 2(b) forming separation region 6 takes place after pn junction 4 is formed. The relatively high diffusion temperatures and long diffusion times required can have an adverse effect on the crystal quality of grown layers 2 and 3, resulting in a loss of the light-to-electricity conversion efficiency of the cells produced. In addition, dopant impurities in layers 2 and 3 diffuse during the diffusion process. That diffusion in layers 2 and 3 causes pn junction 4 to retreat from the front surface of the cell by as much as 2 to 3 microns. In order to achieve the desired radiation resistance for extraterrestrial use, the depth of pn junction 4 from the front surface of the cell is preferably controlled to be about 0.5 microns.

Figure 3:
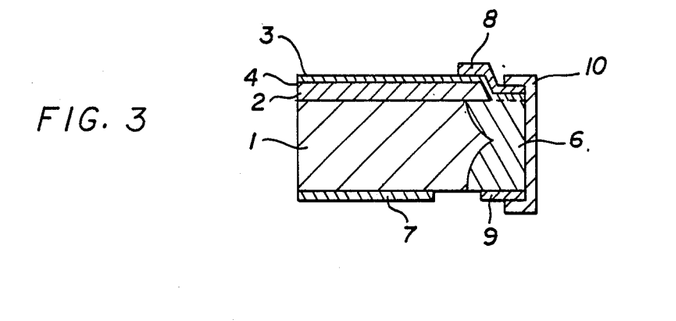
FIG. 3 is a cross-sectional view of another embodiment of a solar cell according to the invention.

These adverse effects of the diffusion process illustrated in FIGS. 2(a)–2(d) are avoided in more preferred embodiments of the invention to be described below. A solar cell embodiment produced according to one of those processes is shown in cross-section in FIG. 3. A process for making the solar cell of FIG. 3 is illustrated in FIGS. 4(a)–4(f) and the same reference numerals are used in those figures, as they are used in all figures in this disclosure, to refer to the same or corresponding elements.

Figure 4A:
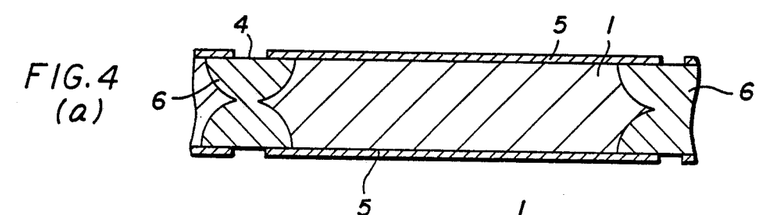
FIGS. 4(a)-(f) are diagrams illustrating a process for producing the solar cell of FIG. 3.

In the process illustrated in FIGS. 4(a)–4(f), separation regions 6 are formed before any epitaxial layers are deposited. In FIG. 4(a), $Si_3N_4$ masks 5 have been deposited on both the front and rear surface of substrate 1 and opposing windows have been opened in each of the masks. Typically, the $Si_3N_4$ masks 5 are about 100 nanometers (nm) thick. When substrate 1 is n-type GaAs, Zn is diffused through the openings in the $Si_3N_4$ masks using the conventional closed tube diffusion process discussed above. The diffusion times and temperatures are approximately the same as described for FIG. 2(b), assuming the thickness of the substrate has not significantly changed. After the diffusion, masks 5 are removed and, if appropriate, the front surface of substrate 1 is prepared for growth of crystalline layers.

Figure 4B:
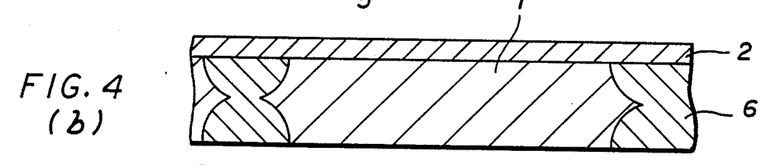
Figure 4C:
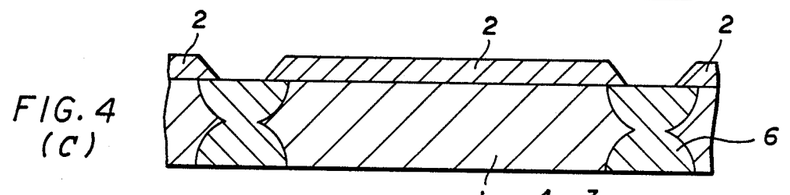

As shown in FIG. 4(b), an n-type GaAs layer 2 about 5 microns thick is grown on the entire front surface of substrate 1. Thereafter, as illustrated in FIG. 4(c), portions of layer 2 are removed to expose separation regions 6 at the front surface of the substrate. The openings in layer 2 are produced by conventional photolithography and etching techniques. These techniques permit alignment of the openings in layer 2 with regions 6.

Figure 4D:
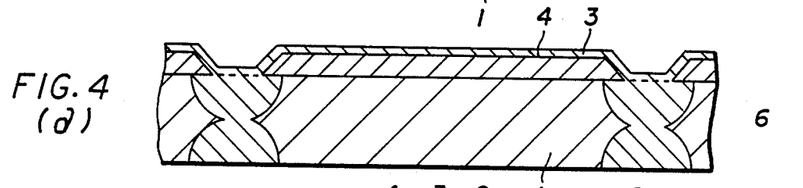

As depicted in FIG. 4(d) in a preferred embodiment, a second crystalline layer 3 of p-type GaAs is grown on the front surface of the cell in contact with layer 2 and the exposed surfaces of separation region 6. Typically, layer 3 is about 0.5 microns thick and, like layer 2, is preferably deposited by a conventional MOCVD method. Where layers 2 and 3 are in contact, pn junction 4 is formed.

Figure 4E:
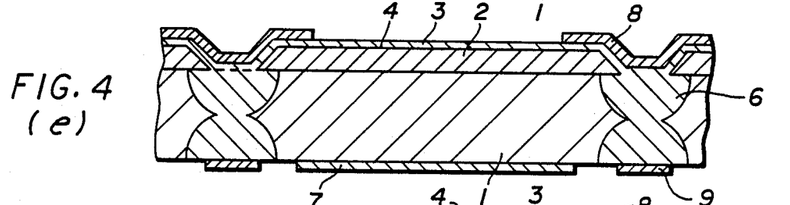

Electrical contacts are then deposited on the structure, as indicated in FIG. 4(e). A metallic rear electrode 7 is deposited on the rear surface of the substrate spaced from and not in contact with separation regions 6. A metallic electrode portion 8 is deposited on a part of the front surface of the structure over separation region 6 and on nearby areas. Electrode portion 9 is deposited on the rear surface of the structure solely on separation region 6.

Figure 4F:
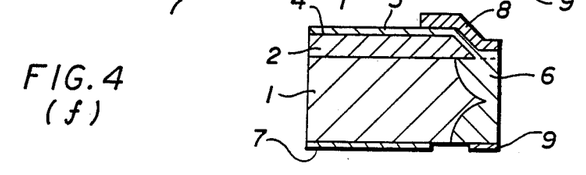

Individual solar cells, as indicated in FIGS. 3 and 4(f), are prepared from the structure of FIG. 4(e) by separating the structure into dice by cutting through separation regions 6. Each cell thus prepared has, at least at one edge transverse to the front and rear surfaces, a surface exposing a separation region 6. Because the conductivity type of separation region 6 is different from that of substrate 1, region 6 provides electrical isolation. That isolation permits the application of an interconnecting electrode portion 10 along the exposed edge of the cell interconnecting electrode portions 8 and 9. Through this interconnection, both of the cell electrodes are accessible from the rear of the cell so that they can be isolated from the environment. The process illustrated in FIGS. 4(a)–4(f) has the advantage of the process of FIGS. 2(a)–2(d) of producing a number of cells from a single substrate, yet overcomes the deleterious effects of the diffusion process of FIGS. 2(a)–2(d) because layers 2 and 3 are deposited after that diffusion. Therefore, the cell of FIG. 3 produced by the illustrated method retains a shallow pn junction depth, giving it good radiation resistance.

Figure 5:
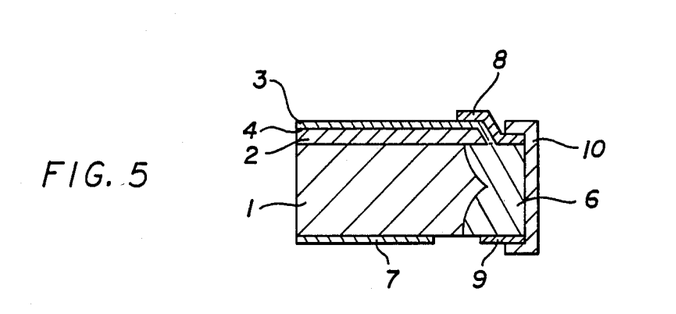
FIG. 5 is a cross-sectional view of still another embodiment of a solar cell according to the invention.
Figures 6A, 6B:
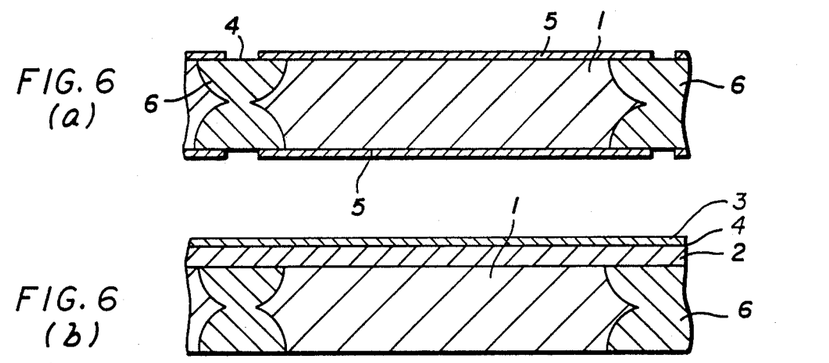
FIGS. 6(a)-(f) are diagrams illustrating a process for producing the solar cell of FIG. 5.
Figure 6C:
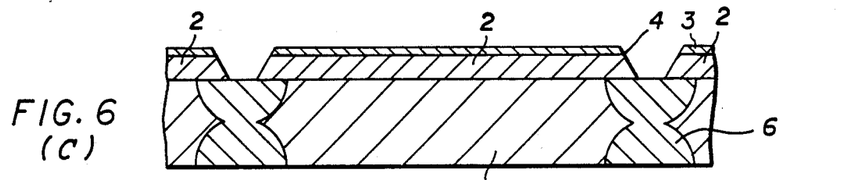

FIG. 5 shows a cross-sectional view of yet another embodiment of a solar cell according to the invention. FIGS. 6(a)–6(f) illustrate the steps in producing the cell of FIG. 5 and describe the presently preferred method for producing the cell. The step illustrated in FIG. 6(a) is identical to that described for FIG. 4(a). In FIG. 6(b), both of the opposite conductivity type layers 2 and 3 are deposited over the entire front surface of substrate 1. Thereafter, as shown in FIG. 6(b), windows are opened through layers 2 and 3 to expose portions of the separation regions 6 at the front surface of substrate 1. Again, conventional photolithography and etching techniques are employed.

Figure 6D:
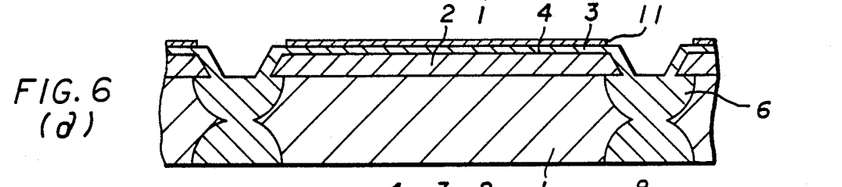
Figures 6E, 6F:
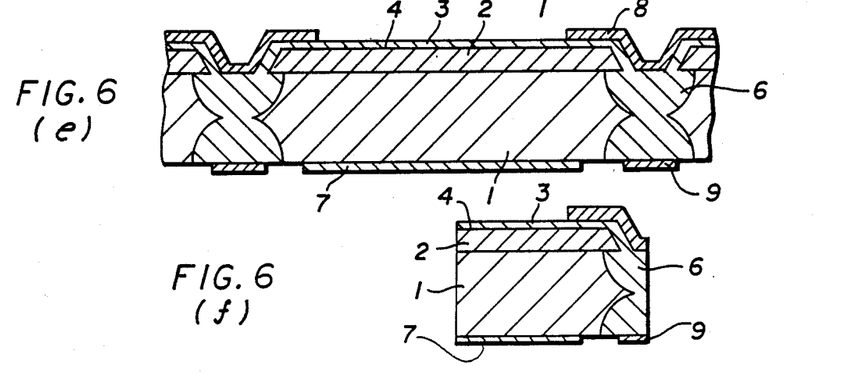

In the process described with respect to FIG. 4(d), electrical communication is established between p-type layer 2 and separation region 6 by growing layer 3 partially on the exposed front surface of region 6. A different technique is employed in the process of FIG. 6(d) to establish electrical communication between layer 3 and separation region 6. As depicted in FIG. 6(d), a diffusion mask 11, which may be $Si_3N_4$, is disposed on all of the front surface of layer 3. Mask 11 is formed by conventional techniques. With mask 11 in place, a p-type dopant, such as Zn, is diffused into the exposed areas, namely, along the exposed oblique surface of layer 2. That diffusion produces a p-type film in that exposed oblique surface, forming a like conductivity electrical connection between layer 3 and separation region 6. The Zn diffusion is carried out by the conventional closed tube technique, but, since only a relatively thin film needs to be produced, a low temperature, e.g., 650° C., and a short period of time, e.g., one hour, are sufficient to produce the desired film. The relatively low temperature and short duration of the diffusion does not adversely affect the crystalline quality of layers 2 and 3 nor cause any significant movement of junction 4 away from the front surface of the cell.

Thereafter, electrodes are formed on the front and rear surfaces of the cell in a manner identical to that described in connection with FIG. 4(e). When substrate 1 is n-type GaAs, metallic contact 7 may be an alloy of gold, germanium, and nickel. Metallic contacts to p-type GaAs, such as electrode portions 8 and 9, may be layers of titanium and silver. These metallic contacts may require a conventional heat treatment at about 400° C. to form ohmic contacts with the GaAs regions on which they are disposed.

After the formation of the electrodes and electrode portions, the substrate is diced, as described earlier, to produce the structure of FIG. 6(f). Finally, interconnecting electrode portion 10 is deposited, for example, by silver plating, to complete the cell of FIG. 5.

As with the other embodiments described, the solar cell of FIG. 5 has a high radiation resistance because its pn junction is relatively shallow, many of the cells can be made from a single substrate, and the cells have a very high light-to-electricity conversion efficiency.

Figures 7A, 7B:
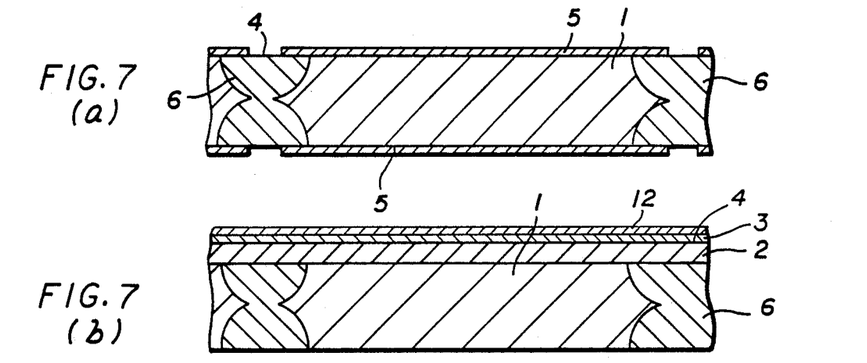
FIGS. 7(a)-7(e) are diagrams illustrating an alternative process for producing a solar cell according to the invention.
Figure 7C:
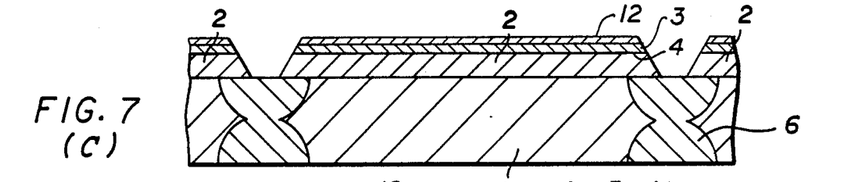
Figure 7D:
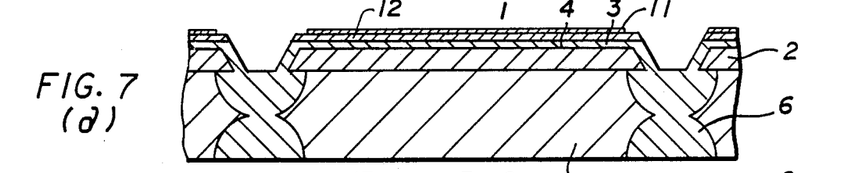
Figure 7E:
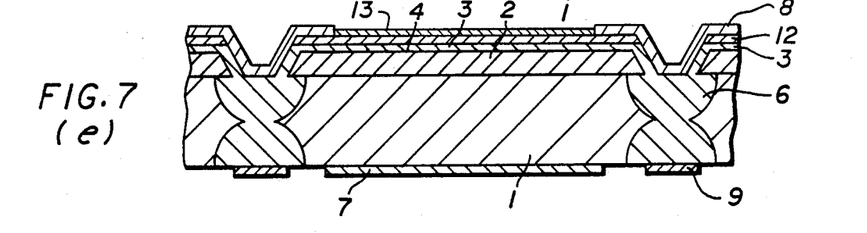
Figures 8A, 8B:
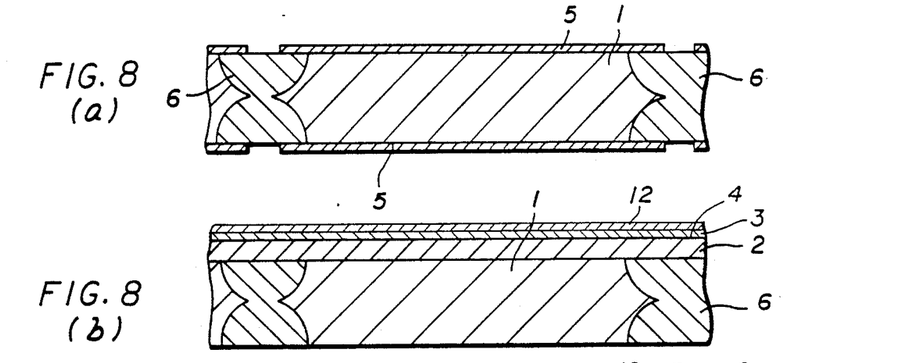
FIGS. 8(a)-8(e) are diagrams illustrating still another process for producing a solar cell according to the invention.
Figure 8C:
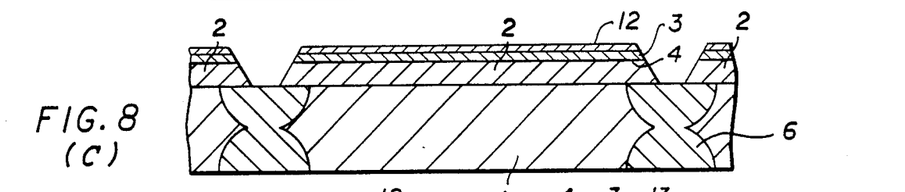
Figure 8D:
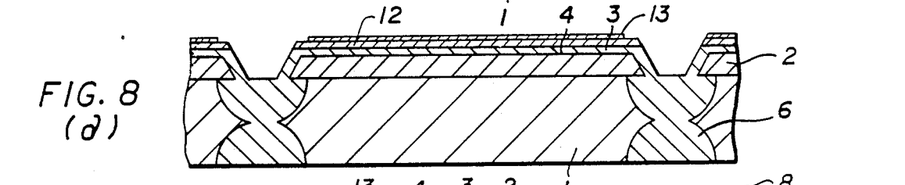
Figure 8E:
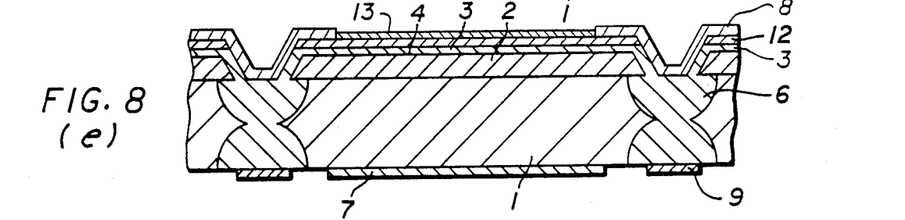

FIGS. 7(a)-7(e), 8(a)-8(e), and 9(a)-9(e) disclose portions of other processes that may be employed to produce solar cells in accordance with the invention. To the extent that those process steps have already been described in connection with other figures, they are not described again. The process steps illustrated in FIGS. 7(a)-7(c) are nearly identical to those described for FIGS. 6(a)-6(c). The sole difference lies in the deposition of a third layer 12 of a semiconducting material of the same conductivity type as layer 3 but having a larger energy band gap. Layer 12 is first shown in FIG. 7(b) and acts as a window layer, absorbing very little of the incident light that is absorbed by layers 3 and 2 because of its wider energy band gap. However, layer 12 provides additional protection to the underlying layers 2 and 3. A typical window material for a GaAs layer is $Al_xGa_{1-x}As$ which may be grown by an MOCVD process. In FIG. 7(c), windows are opened through all deposited layers to expose portions of separation regions 6, just as in FIG. 6(c). As in FIG. 6(d), a diffusion mask 11, such as $Si_3N_4$, is applied over the front surface of the structure. Thereafter, as in FIG. 6(d), a Zn diffusion is carried out, as indicated in FIG. 7(d), to interconnect p-type layer 3 with separation regions 6. In FIG. 7(e), metallic contacts 7, 8, and 9 have been applied to the structure just as described for FIG. 6(e). In addition, mask 11 has been removed and an anti-reflection film 13 has been applied to the front surface of the cell between electrode portions 8. Use of anti-reflecting film employing interference phenomena is well known in the art. An example of a film that may be used is $Si_3N_4$ to a thickness of about 75 nm.

Where an anti-reflection film can be $Si_3N_4$, the same film 13 can be employed both as a diffusion mask and as the anti-reflection film. This embodiment is illustrated in the steps of FIGS. 8(a)-8(e), which are identical to those of FIGS. 7(a) -7(e), except that mask 11 is replaced by anti-reflection film 13 which serves both as a diffusion mask and anti-reflection film.

Figure 9A:
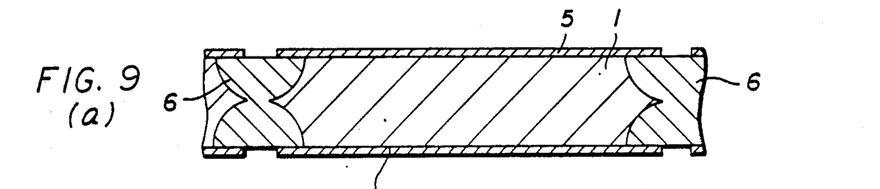
FIGS. 9(a)-9(e) are diagrams illustrating yet another process for producing a solar cell according to the invention.
Figure 9B:
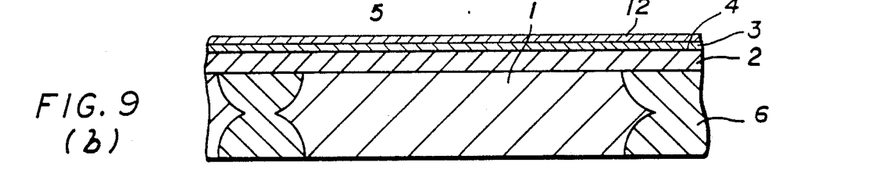
Figure 9C:
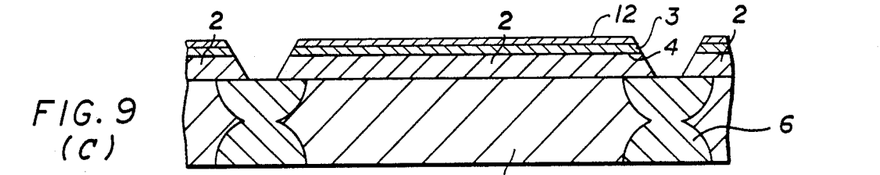
Figure 9D:
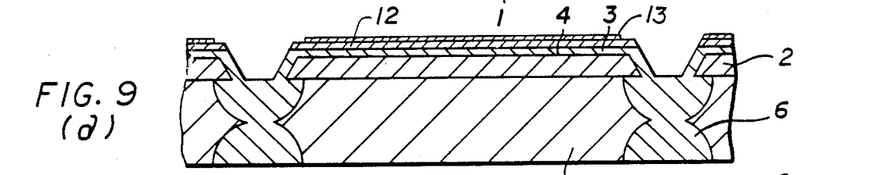
Figure 9E:
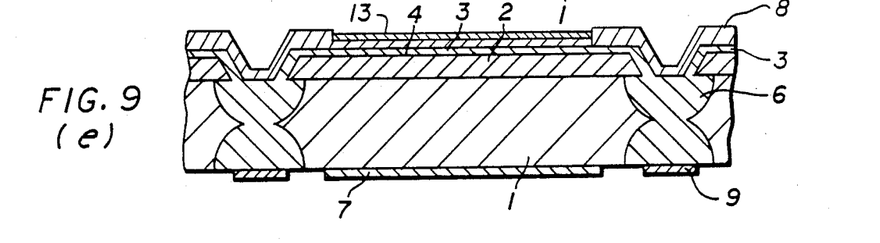

Still another similar method for producing a solar cell according to the invention is illustrated in FIGS. 9(a)-9(e). FIGS. 9(a)-9(d) are identical to FIGS. 8(a)-8(d) and, therefore, do not require detailed explanation. However, a subtle difference is employed in the processing illustrated in FIG. 9(e) to improve the performance of the electrical contacts. After the stage depicted in FIG. 9(d) is reached, but before electrode portions 8 are deposited, an additional masking and etching step is carried out. In that step, the results of which are indicated in FIG. 9(e), the portions of window layer 12 that are disposed on areas of layer 3 that will be covered by electrode portions 8 are removed by etching. Thereafter, when electrode portion 8 is deposited, it directly contacts layer 3. That direct contact reduces the contact resistance and improves contact adhesion resulting in better cell performance compared to that of the structure of FIG. 8(e).

Figures 10A, 10B:
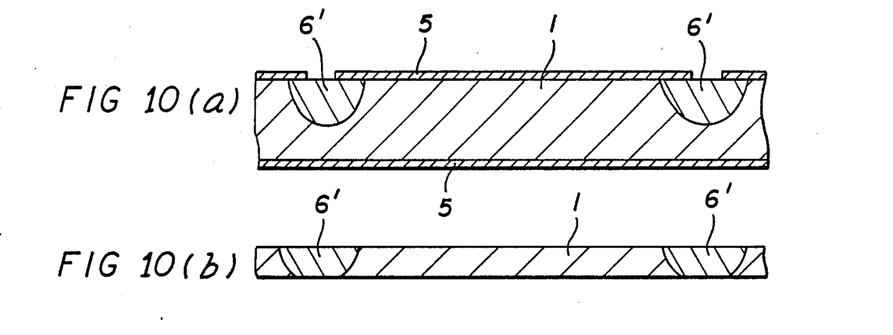
FIGS. 10(a) and 10(b) are diagrams illustrating a portion of a process for producing a solar cell according to the invention.

FIGS. 10(a) and 10(b) illustrate a portion of an alternative process that may be substituted in the beginning steps of various of the other processing techniques described above. In FIG. 10(a), a substrate 1 has both its rear and front surfaces coated with a diffusion mask, such as a $Si_3N_4$ film 5, to a thickness of about 100 nm. Windows are opened in the mask only at the front surface of the substrate rather than at both the front and rear surfaces as illustrated above for other processes. Thereafter, an impurity diffusion is carried out, such as the closed tube Zn diffusion described above, to form regions 6' of opposite conductivity type from that of substrate 1. Unlike the separation regions described above, regions 6' do not extend all of the way through substrate 1 from the front surface to the rear surface. However, as illustrated in FIG. 10(b), the diffused regions 6' are converted into separation regions 6 extending through substrate 1 by grinding away the rear surface of the substrate to expose the diffused regions. The rear surface may be ground by conventional lapping and polishing techniques using various abrasives and/or etchants. The production method of this embodiment is useful in the case where a thin solar cell is produced by rear surface polishing.

The solar cell embodiments have been described with particular reference to GaAs and emphasizing use of an n-type GaAs substrate. However, solar cells according to the invention may employ various elemental and compound semiconductor materials in the active layers and as a substrate. For example, silicon may be used as a substrate and a III–V compound semiconductor, such as GaAs and indium phosphide, may be used for the semiconductor layers forming the pn junction. That combination can simplify the manufacturing process, since the diffusion step forming the separation regions is more easily achieved in silicon than in compound semiconductors, such as GaAs.

What is claimed is:

1. A solar cell comprising:
   a compound semiconductor substrate of a first conductivity type having opposed front and rear surfaces including at least one separation region for receiving an interconnecting electrode, said separation region extending through said substrate from said front surface to said rear surface, said separation region having a second conductivity type different from the first conductivity type;
   a first compound semiconductor layer of the first conductivity type disposed on the front surface of said substrate;
   a second compound semiconductor layer of the second conductivity type disposed on said first layer opposite said substrate and forming a rectifying junction with said first layer, said second layer being in electrical communication with said separation region;
   a first electrode disposed on the rear surface of said substrate and spaced from said separation region; and
   an interconnecting electrode in electrical communication with said second layer at said front surface and extending to said rear surface over said separation region.

2. The solar cell of claim 1 wherein said substrate is n-type.

3. The solar cell of claim 2 wherein said substrate is GaAs.

4. The solar cell of claim 1 wherein said first and second layers of GaAS.

5. The solar cell of claim 4 wherein said first and second layers are epitaxially grown.

6. The solar cell of claim 1 wherein the separation region comprises a diffusion region having impurities diffused therein for establishing the second conductivity type.

7. The solar cell of claim 1, said second compound semiconductor layer having a first energy band gap, wherein said solar cell includes a third semiconductor layer disposed on said second semiconductor layer, said third semiconductor layer being of the same conductivity type as said second layer and having a second energy band gap larger than the first energy band gap.

8. The solar cell of claim 7 wherein said first and second layers are GaAs and said third layer is $Al_xGa_{1-x}As$.

9. The solar cell of claim 7 including an anti-reflecting film disposed on said third semiconductor layer.

10. The solar cell of claim 9 wherein said anti-reflecting film is $Si_3N_4$.

11. The solar cell of claim 1 wherein said interconnecting electrode comprises a first electrode portion disposed on said second layer and on said separation region at said front surface, a second electrode portion disposed on said separation region at said rear surface, and an interconnecting electrode portion extending along said substrate from said front surface to said rear surface and electrically interconnecting said first and second electrode portions.

12. The solar cell of claim 11 wherein said substrate is n-type GaAs, said first and second layers are GaAs, and said first and second electrode portions are layers of titanium and silver.

13. The solar cell of claim 12 wherein said interconnecting portion is silver.

14. The solar cell of claim 12 wherein said first electrode is an alloy of gold, germanium, and nickel.

15. A method for making a solar cell employing a semiconductor substrate of a first conductivity type and having opposed front and rear surfaces, comprising:
forming in said substrate at least one separation region extending between the front surface and rear surface and having a second conductivity type different from said first conductivity type;
depositing on the front surface of the substrate a first semiconductor layer of said first conductivity type;
depositing on the first layer a second semiconductor layer of a second conductivity type to form a rectifying junction with said first layer;
establishing electrical communication between said second layer and said separation region at said front surface;
forming a first electrode on the rear surface of the substrate spaced from said separation region; and
forming a second electrode in electrical communication with said second layer at said front surface and extending to said rear surface over said separation region.

16. The method of claim 15 wherein said first and second layers are deposited before said separation region is formed.

17. The method of claim 16 wherein forming said second electrode comprises forming a first electrode portion on said second layer and said separation region at said front surface, forming a second electrode portion on said rear surface on said separation region, separating said substrate into two or more parts, and depositing an interconnecting electrode portion extending along said separation region of said substrate from said front surface to said back surface to interconnect said first and second electrode portions.

18. The method of claim 17 including separating said substrate into two or more parts to expose the separation region along an edge of the substrate and depositing said interconnecting portion at least partially on said edge.

19. The method of claim 15 wherein forming said second electrode comprises forming a first electrode portion on said second layer and said separation region at said front surface, forming a second electrode portion on said rear surface on said separation region, separating said substrate into two or more parts, and depositing an interconnecting electrode portion extending along said separation region of said substrate from said front surface to said back surface to interconnect said first and second electrode portions.

20. The method of claim 19 including separating said substrate into two or more parts to expose the separation region along an edge of the substrate and depositing said interconnecting portion at least partially on said edge.

21. The method of claim 20 including plating silver as said interconnecting electrode portion.

22. The method of claim 15 including forming said separation region by masking the front and rear surfaces, removing a portion of the mask on the front surface, and diffusing a dopant impurity through said removed mask portion into said substrate.

23. The method of claim 22 wherein said first and second layers are deposited after said separation region is formed.

24. The method of claim 22 including removing a portion of the substrate at said rear surface to expose said separation region at said rear surface.

25. The method of claim 22 including removing a portion of the mask on the rear surface, generally aligned with the removed portion of the mask on the front surface, and diffusing said dopant impurity through said removed mask portions on the front and rear surfaces to form said separation region.

26. The method of claim 15 including depositing said first and second layers epitaxially by a chemical vapor deposition process.

27. The method of claim 26 including epitaxially growing GaAs as said first and second layers by a metal-organic chemical vapor deposition process.

28. The method of claim 15 including establishing electrical connection by, before depositing said second layer, removing a portion of said first layer overlying said separation region to expose said separation region at said front surface, and depositing said second layer on said first layer and on said exposed separation region.

29. The method of claim 15 including establishing electrical connection by, after depositing said second layer, removing overlying portions of said first and second layers to expose said separation region and part of said first layer at said front surface, masking said second layer against diffusion of dopant impurities, and diffusing dopant impurities into the exposed portion of said first layer to form a film of said second conductivity type electrically interconnecting said second layer to said separation region.

30. The method of claim 15 including depositing a third semiconductor layer on said second layer opposite said first layer before said establishing electrical connection step wherein said third semi-conductor layer is of said second conductivity type and has an energy band gap larger than the energy band gap of said second semiconductor layer.

31. The method of claim 30 wherein said first and second layers are GaAs and including depositing said third layer by growing $Al_xGa_{1-x}As$ by a chemical vapor deposition process.

32. The method of claim 30 including establishing electrical connection by, after depositing said third layer, removing overlying portions of said first, second, and third layers to expose said separation region and part of said first layer at said front surface, masking said third layer against diffusion of dopant impurities into it, and diffusing dopant impurities into the exposed portion of said first layer to form a film of said second conductivity type electrically interconnecting said second layer to said separation region.

33. The method of claim 32 wherein said first and second layers are GaAs and including depositing said third layer by growing $Al_xGa_{1-x}As$ by a chemical vapor deposition process.

34. The method of claim 32 including depositing an anti-reflecting film as a diffusion mask on said third layer.

35. The method of claim 32 including depositing $Si_3N_4$ on said third layer as a diffusion mask and as an anti-reflecting film.

36. The method of claim 32 including, after said diffusion step to electrically interconnect said second layer to said separation region and before forming said second electrode, removing portions of the third layer disposed adjacent said separation region, whereby said second electrode can directly contact said second layer at the outermost front surface of said substrate.

37. A plurality of mechanically interconnected solar cells comprising:
   a common semiconductor substrate of a first conductivity type having opposed front and rear surfaces including at least two separation regions extending through said substrate from said front surface to said rear surface, said separation regions having a second conductivity type different from the first conductivity type;
   a first semiconductor layer of the first conductivity type disposed on said front surface of said substrate, said first layer being discontinuous at said separation regions;
   a second semiconductor layer of the second conductivity type disposed on said first layer opposite said substrate and forming a rectifying junction with said first layer, said second layer being in electrical communication with said separation regions;
   first electrode disposed on said rear surface adjacent and spaced from each of said separation regions; and
   second electrode disposed on said front surface in electrical communication with respective ones of said separation regions.

38. The interconnected solar cells of claim 37 wherein said substrate is n-type.

39. The interconnected solar cells of claim 38 wherein said substrate is GaAs.

40. The interconnected solar cells of claim 37 wherein said first and second layers are GaAs.

41. The interconnected solar cells of claim 40 wherein said substrate is silicon.

42. The interconnected solar cells of claim 40 wherein said first and second layers are epitaxially grown.

43. The interconnected solar cells of claim 37 wherein the separation regions comprise diffusion regions having impurities diffused therein for establishing the second conductivity type.

44. The interconnected solar cells of claim 37, said second semiconductor layer having a first energy band gap, wherein said solar cell includes a third semiconductor layer disposed on said second semiconductor layer, said third semiconductor layer being of the same conductivity type as said second semiconductor layer and having a second energy band gap larger than the first energy band gap.

45. The interconnected solar cells of claim 44 wherein said first and second layers are GaAs and said third layer is $Al_xGa_{1-x}As$.

46. The interconnected solar cells of claim 44 including an anti-reflecting film disposed on said third semiconductor layer.

47. The interconnected solar cells of claim 46 wherein said anti-reflecting film is $Si_3N_4$.

48. The interconnected solar cells of claim 37 wherein said first electrode comprises a portion disposed on said second layer and on one of said separation regions at said front surface.

49. The interconnected solar cells of claim 48 wherein said substrate is n-type GaAs, said first and second layers are GaAs, and said first electrode portion comprises layers of titanium and silver.

50. The interconnected solar cells of claim 48 wherein said first electrode portion comprises an alloy of gold, germanium, and nickel.

* * * * *